US007817442B2

(12) United States Patent
Yamanaka

(10) Patent No.: US 7,817,442 B2
(45) Date of Patent: Oct. 19, 2010

(54) INPUT DEVICE

(75) Inventor: Satoshi Yamanaka, Yao (JP)

(73) Assignee: Hosiden Corporation, Yao-shi (JP)

( * ) Notice: Subject to any disclaimer, the term of this patent is extended or adjusted under 35 U.S.C. 154(b) by 561 days.

(21) Appl. No.: 11/892,453

(22) Filed: Aug. 23, 2007

(65) Prior Publication Data

US 2008/0047811 A1 Feb. 28, 2008

(30) Foreign Application Priority Data

Aug. 28, 2006 (JP) ............................ 2006-230229

(51) Int. Cl.
*H05K 9/00* (2006.01)

(52) U.S. Cl. ....................... 361/799; 361/753; 361/816; 361/818; 174/350; 200/4

(58) Field of Classification Search ................. 361/753, 361/799, 800, 816, 818; 174/350, 377; 200/4
See application file for complete search history.

(56) References Cited

U.S. PATENT DOCUMENTS

| | | | | |
|---|---|---|---|---|
| 6,229,103 | B1 | 5/2001 | Yamamoto et al. | 200/4 |
| 2003/0099351 | A1 | 5/2003 | Su | 379/419 |
| 2005/0098422 | A1 | 5/2005 | Nishimura et al. | 200/559 |
| 2005/0150749 | A1 | 7/2005 | Lung | 200/4 |

FOREIGN PATENT DOCUMENTS

| | | | |
|---|---|---|---|
| CN | 1160919 A | * | 10/1997 |
| CN | 1194053 A | * | 9/1998 |
| CN | 1617276 A | * | 5/2005 |
| CN | 2909631 Y | | 6/2007 |
| EP | 1477999 | | 5/2004 |
| JP | 61-101931 | | 6/1986 |
| JP | 1-160629 | | 11/1989 |
| JP | 05-002948 | | 1/1993 |
| JP | 06-251913 | | 9/1994 |
| JP | 09-063416 | | 3/1997 |
| JP | 9-63416 | | 3/1997 |
| JP | 09-274830 | | 10/1997 |
| JP | 3048274 | | 2/1998 |

(Continued)

OTHER PUBLICATIONS

Japanese Office Action dated Nov. 18, 2008 (in Japanese).

(Continued)

*Primary Examiner*—Dameon E Levi
(74) *Attorney, Agent, or Firm*—Kratz, Quintos & Hanson, LLP

(57) ABSTRACT

An input device of the invention includes a body formed with an accommodating part; an operation member having a basal end accommodated in the accommodating part and a distal end projected in a swinging operable manner to either side in a width direction and in a pushing operable manner from an neutral position; and an earth terminal for dissipating static electricity charged in the operation member. The input device is attachable to a circuit board. The earth terminal, being a metal plate insert molded in a wall, includes a contacting portion and first and second projections arranged near the operation member, and connecting parts exposed from the other end face of the body and solder connectable to respective earth patterns of the circuit board.

17 Claims, 8 Drawing Sheets

FOREIGN PATENT DOCUMENTS

| | | |
|---|---|---|
| JP | 11-144921 | 5/1999 |
| JP | 2001-250451 | 9/2001 |
| JP | 2003-51228 | 2/2003 |
| JP | 2003-297175 | 10/2003 |
| JP | 2005-149738 | 6/2005 |
| JP | 2005-149925 | 6/2005 |

OTHER PUBLICATIONS

Japanese Office Action dated Feb. 24, 2009 (in Japanese).

Chinese Office Action dated May 8, 2009 with its English translation.

Chinese Office Action dated Jan. 8, 2010 (with its English translation).

* cited by examiner (a)

(b)

200

(a)

(b)

(a)

(b)

500

(a)

(b)

INPUT DEVICE

The present application claims priority under 35 U.S.C. §119 of Japanese Patent Application No. 2006-230229 filed on Aug. 28, 2006, the disclosure of which is expressly incorporated by reference herein in its entity.

BACKGROUND OF THE INVENTION

1. Field of the Invention

The present invention relates to input devices included in small electronic equipment, such as mobile terminal devices, for inputting operation to the electronic equipment.

2. Description of the Related Art

In some input devices of this kind, when an operation member is moved by a swinging operation movement in the left and right direction or a pushing operation movement in the up and down direction, a movable contacting point part moves accordingly and thereby selectively contacting four fixed contacting point parts arranged on an inner wall surface of a case to switch the corresponding switching means (switching means made up of the selected movable contacting point part and the corresponding fixed contacting point part) (see Japanese Utility Model Registered No. 3048274 and Japanese Laid-Open Patent Publication No. 2005-149925).

Such an input device has a drawback in that static electricity charged when a user touches the operation member may flow through the operation member to an internal circuit such as the switching means. To overcome such a drawback, there is known an input device having an earth terminal arranged in the vicinity of the operation member (see Japanese Laid-Open Patent Publication No. 09-63416).

In such an input device, a signal terminal and an earth terminal are arranged on one metal plate, which is insert molded in a case, and later a coupling part of the signal terminal and the earth terminal is split. That is, it is required to provide a separate process of separating the signal terminal and the earth terminal after integrally arranging the signal terminal and the earth terminal in the case. Such separate process leads to increased manufacturing steps.

Furthermore, since the earth terminal must be folded at a right angle before being solder connected to the circuit board, another separate process is required before solder connection, which also leads to increased manufacturing steps.

SUMMARY OF THE INVENTION

The present invention is proposed in view of the above situation, and aims to provide an input device capable of easily performing assembly and electrical connection of the earth terminal.

In order to overcome such problems, the present invention provides an input device mountable on a circuit board, the circuit board including an electrode pattern and an earth pattern, the input device comprising a body having an accommodating part formed at one end; an operation member having a basal end accommodated in the accommodating part and a distal end projected from the accommodating part in an operable manner; a fixed contacting point part integrally arranged with the body and exposed to the accommodating part so as to be electrically connectable to the electrode pattern; a movable contacting point part arranged at the basal end of the operation member and slidably movable on the fixed contacting point part in concert with operation movement of the operation member; and an earth terminal for discharging static electricity charged in the operation member, being electrically connectable to the earth pattern, wherein the earth terminal is integrally arranged with the body and includes a receiving part exposed from the body and positioned near the operation member and a connecting part exposed from the other end face of the body and solder connectable to the earth pattern of the circuit board.

In the claimed input device, the earth terminal is integrally arranged with the body; particularly, the receiving part of the earth terminal is exposed from the body and arranged near the operation member, while the connecting part of the earth terminal is exposed from the other end face of the body. Consequently, the earth terminal and the fixed contacting point part can be easily assembled to the body without performing a separate preceding or following process as in the prior art. Furthermore, the connecting part of the earth terminal is exposed from the other end face of the body and solder connectable to the earth pattern of the circuit board. Such earth terminal can be easily electrically connected to the circuit board without performing a separate preceding or following process as in the prior art.

The input device may further include a frame ground attached to the one end of the body so as to cover the accommodating part and contactable with the basal end of the operation member. In this case, the frame ground includes a connecting piece exposed from the other end face of the body and solder connectable to the earth pattern of the circuit board.

The static electricity charged in the operation member is thus more suitably discharged by using the frame ground in addition to the earth terminal. Furthermore, as the connecting piece of the frame ground is exposed from the other end face of the body and solder connected to the earth pattern of the circuit board, the frame ground can be easily electrically connected to the earth pattern of the circuit board without performing a separate process. Moreover, the connecting piece of the frame ground is exposed from the same surface of the body as the connecting part of the earth terminal so as to be solder connected to the earth pattern. As a result, solder connection can be carried out all at once using solder reflow etc. and thus the input device of the invention is suited for mass production.

The connecting piece of the frame ground and the connecting part of the earth terminal are preferably exposed from the other end face of the body so as to be positioned close to each other and are solder connectable integrally to the earth pattern of the circuit board. In this case, the connecting piece of the frame ground and the connecting part of the earth terminal are solder connected all at once to the earth pattern of the circuit board.

It is preferable that the connecting piece of the frame ground is functions as a locking piece, and in a state of being locked to a locking part formed on the body, a distal end of the connecting piece is exposed from the other end face of the body. The connecting piece also functioning as a locking piece, the device can be manufactured with a reduced number of components and can be miniaturized.

The fixed contacting point part preferably includes a connecting end exposed from the other end face of the body and solder connectable to the electrode pattern of the circuit board.

Thus, the fixed contacting point part is easily electrically connected to the electrode pattern of the circuit board by exposing the connecting end of the fixed contacting point part from the other end face of the body and solder connecting the same to the electrode pattern of the circuit board. Furthermore, since the connecting end of the fixed contacting point part is exposed from the same surface of the body as the connecting piece of the frame ground and the connecting part of the earth terminal so as to be solder connected to the electrode pattern, solder connection can be carried out all at once using solder reflow etc. Therefore, the input device of the invention is suited for mass production.

An accommodating concave part for accommodating the connecting end of the fixed contacting point part is preferably formed in the other end face of the body. In this case, the connecting end of the fixed contacting point part is prevented from projecting out from the other end face side of the body as the connecting end is accommodated in the accommodating concave part. Thus, the thickness dimension of the device can be reduced.

The operation member may be swinging operable to either side from an neutral position substantially perpendicular to a bottom surface of the accommodating part and may also be pushing operable from the neutral position. In this configuration, the accommodating part of the body may include an opening part for projecting the distal end of the operation member in an operable manner; a pair of projections may be formed at opposite ends in a swinging direction of the distal end of the operation member; and the pair of projections may be guided by both edges in the swinging direction of the opening part when the operation member is pushed down, and one of the projections may be contactable with one of the edges in the swinging direction of the opening part when the operation member is swung.

That is, in a press-down operation, the pair of projections of the operation member is guided by the both edges of the opening part of the body. Even if the operation member is carelessly swing operated during the press-down operation, one of the projections on the swinging operation direction side contacts one of the edges of the opening part of the body, thereby preventing the swinging operation. On the other hand, in a swinging operation, one of the projections on the swinging operation direction side of the operation member is positioned above and contactable to the edge on the swinging operation direction side of the opening part of the body. Thus, even if the operation member is carelessly pressed down during the swinging operation, the lower end of the one projection contacts the one edge, thereby preventing the press-down operation.

The frame ground may include a movable piece part defined by a slit, and a hill part formed at a central part of the movable piece part. The basal end of the operation member may be provided with a contacting part in a convex shape for riding over the hill part upon pushing movement of the operation member.

In other words, when the operation member is pressed down, the contacting part of the operation member contacts and rides over the hill part of the frame ground. The movable piece part of the frame ground thereby elastically deforms. An operation feeling is thereby generated in the pushing operation of the operation member.

According to the input device of the present invention, the earth terminal can be easily assembled to the body and electrically connected to the circuit board without performing a separate preceding or following process as in the prior art. Consequently, the invention can reduce the number of manufacturing steps and the cost.

DETAILED DESCRIPTION OF THE PREFERRED EMBODIMENTS

An input device according to the embodiment of the present invention will now be described with reference to the drawings.

Figure 1:
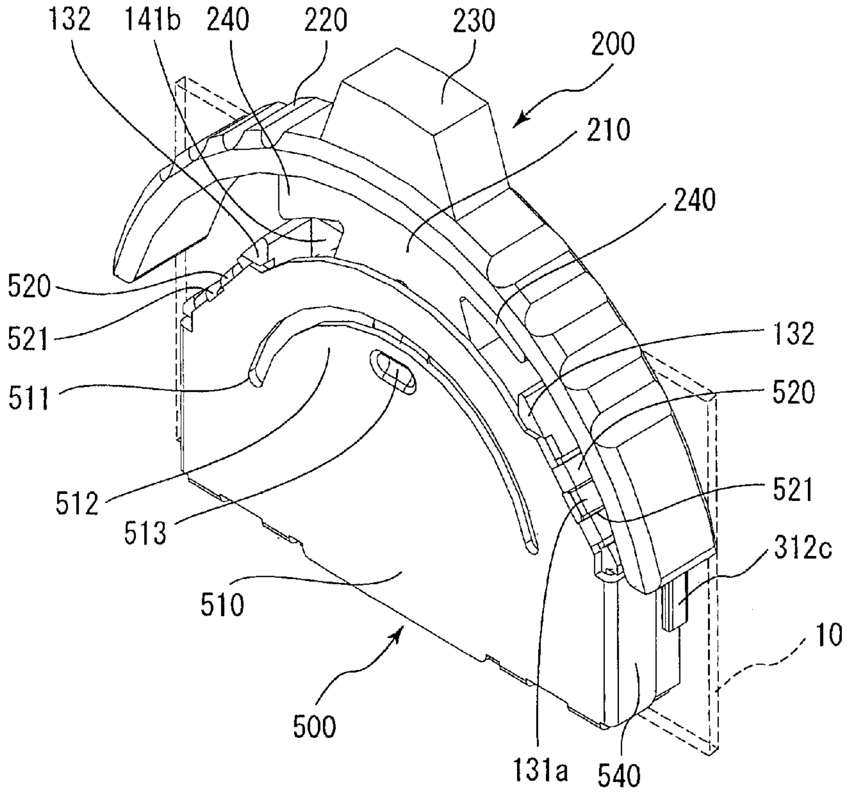
FIG. 1 is a schematic perspective view of an input device according to the embodiment of the present invention where (a) is a view showing the device from one end side in the thickness direction and (b) is a view showing the device from the other end side in the thickness direction.
Figure 1:
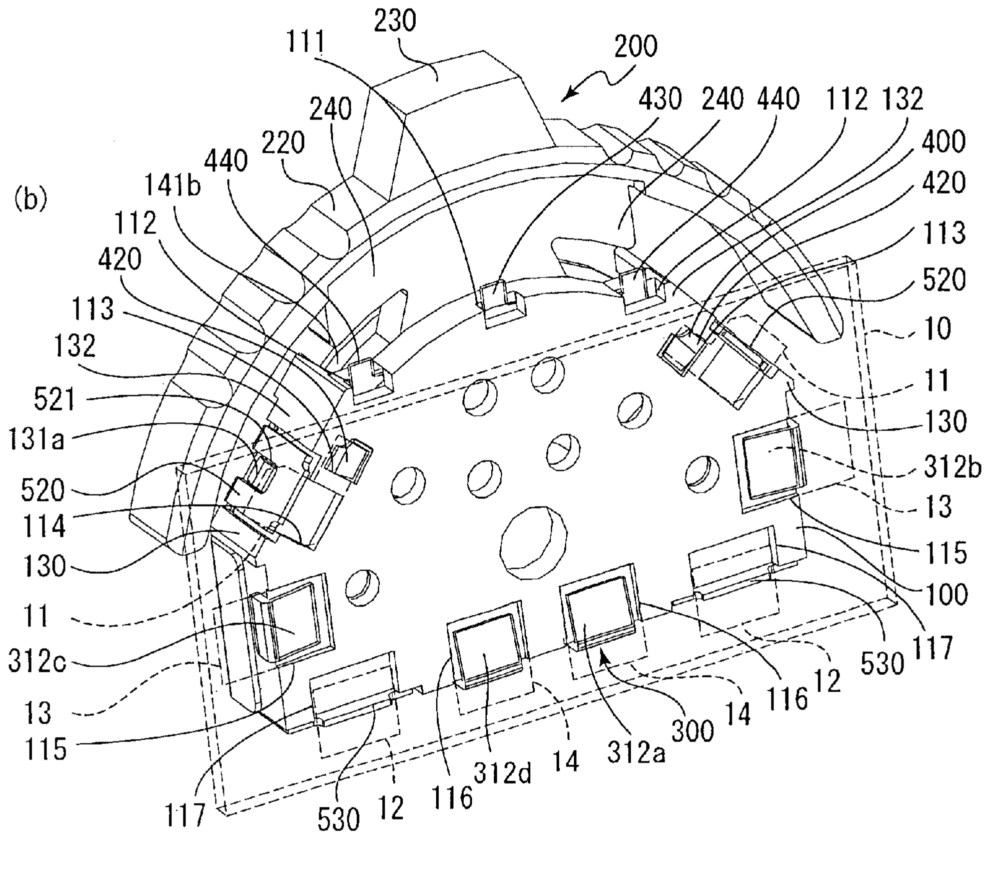
Figure 2:
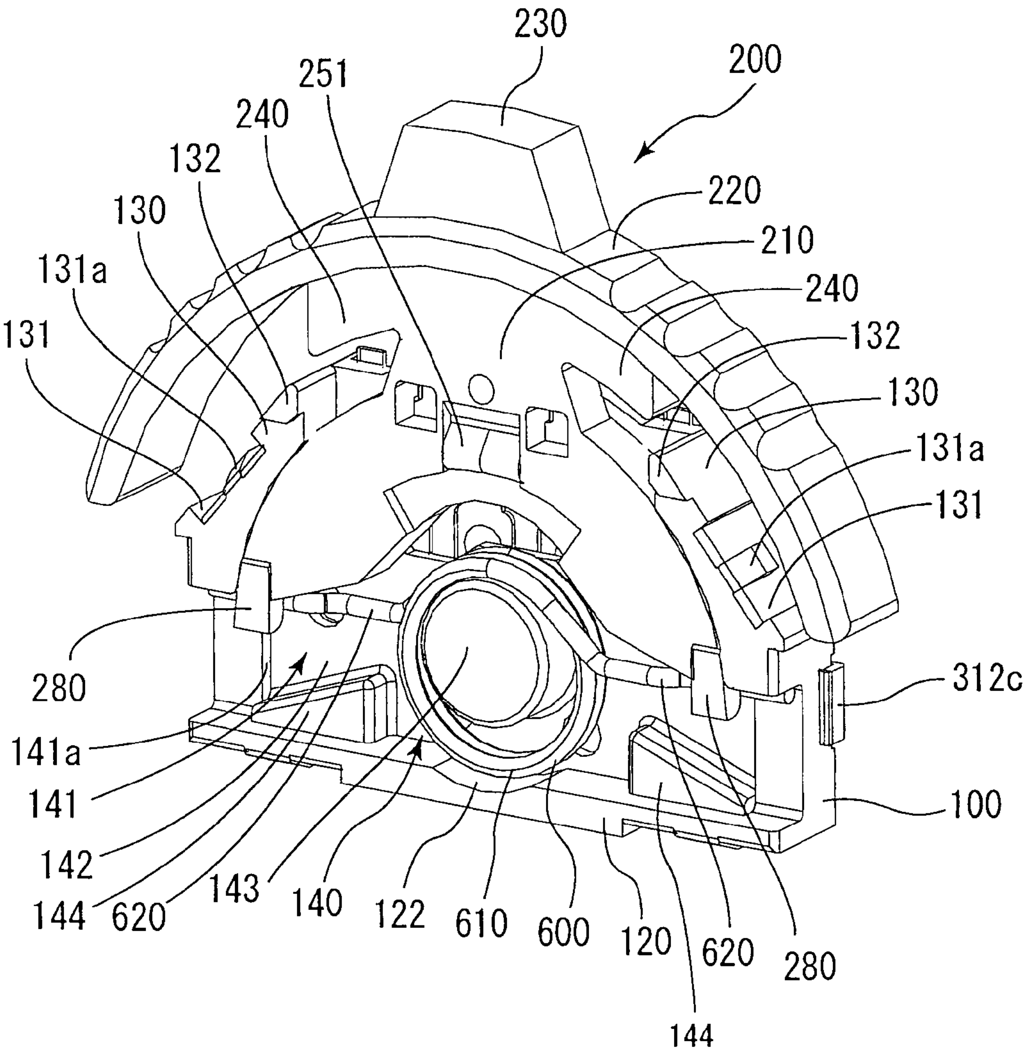
FIG. 2 is a schematic perspective view showing a state in which a frame ground of the device is detached.

The input device shown in FIGS. 1 and 2 includes a body 100 having an accommodating part 140 formed at one end in the thickness direction; an operation member 200 having a basal end accommodated in the accommodating part 140 and a distal end projecting in a swinging operable manner to opposite sides in the width direction from an neutral position perpendicular to a bottom surface of the accommodating part 140 and in a pushing operable manner; a movement detecting means 300 for detecting the swinging and pressing movements of the operation member 200; an earth terminal 400 for dissipating static electricity charged at the operation member 200; a frame ground 500 attached to one end of the body 100 and contacted to the basal end of the operation member 200; and a returning means 600 for returning the move operated operation member 200 to the neutral position. The input device is attachable to a circuit board 10.

Figure 3:
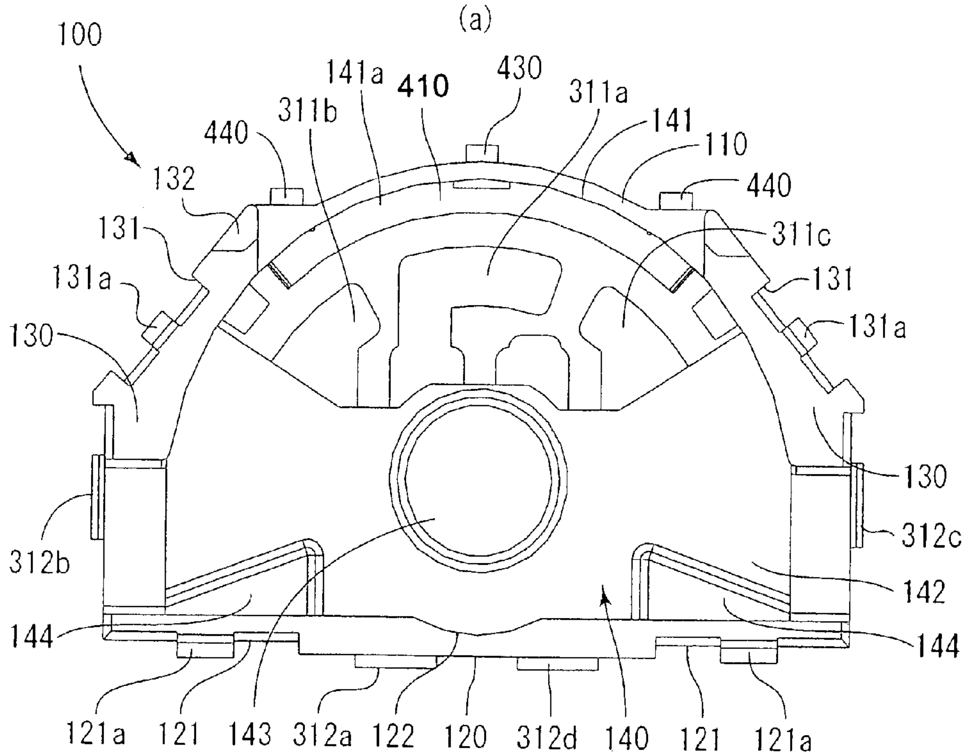
FIG. 3 is a view showing a body insert molded with fixed contacting point parts of the device, where (a) is a schematic front view of the body and (b) is a schematic rear view of the body.
Figure 3:
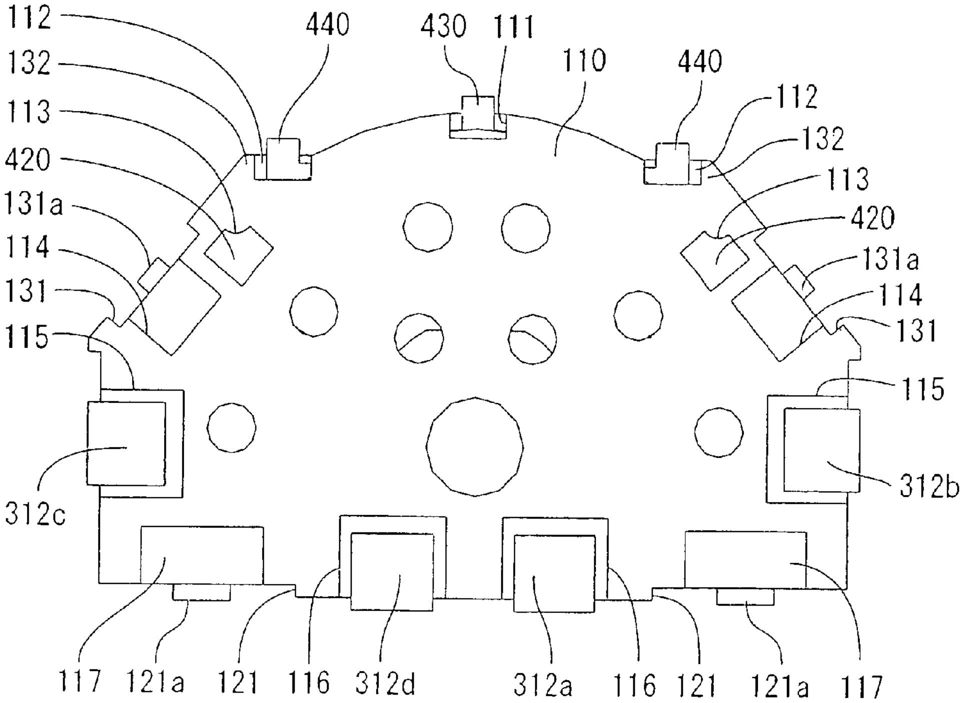
Figure 4:
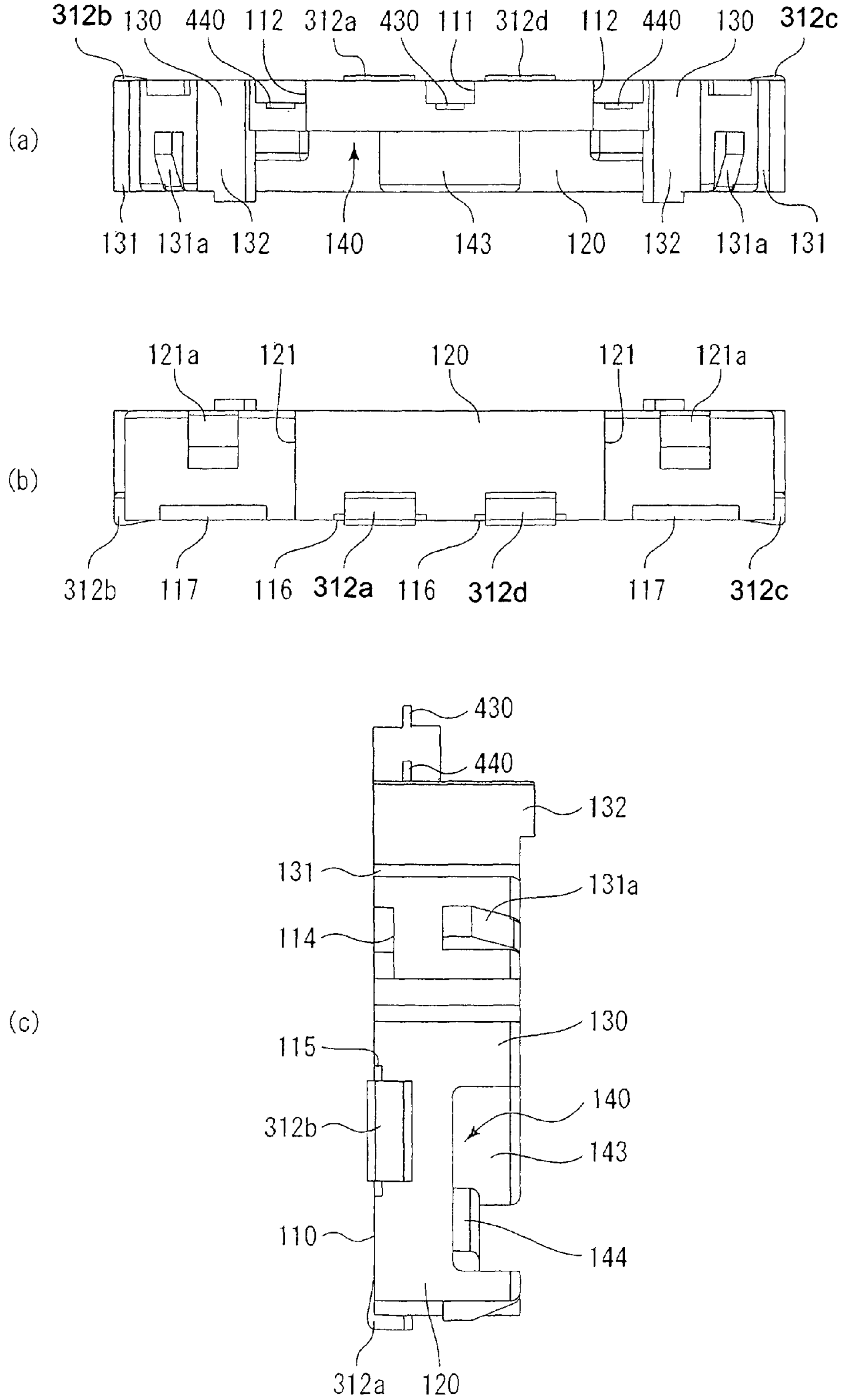
FIG. 4 is a view showing a body insert molded with the fixed contacting point parts of the device, where (a) is a schematic plan view of the body, (b) is a schematic bottom view of the body, (c) is a schematic side view of the body.

As shown in FIGS. 2, 3, and 4, the body 100 is a molded article made of resin, including a wall 110 of a substantially semicircular shape, in which the earth terminal 400 and first, second, third, and fourth fixed contacting point parts 310*a*, 310*b*, 310*c*, 310*d* of the movement detecting means 300 are insert molded; a bottom plate 120 arranged at a right angle to the lower end of one end face (hereinafter referred to as "inner face") in the thickness direction of the wall 110; a pair of overhanging parts 130 overhanging in the same direction as the bottom plate 120 at both sides of the top part of the inner face of the wall 110; and the accommodating part 140 formed in the inner face side of the wall 110.

Looking at the other end face (hereinafter referred to as "outer face") in the thickness direction of the wall 110, the top part is provided with a first cut-out part 111 for projecting a first projection 430 of the earth terminal 400. On opposite sides of the top part on the outer face (i.e., the other end face in the thickness direction of the body 100) of the wall 110, there are formed a pair of second cut-out parts 112 for projecting a pair of second projections 440 of the earth terminal 400, a pair of introducing holes 113 for leading out a pair of connecting parts 420 of the earth terminal 400, and a pair of first solder concave parts 114 for solder connecting a pair of first connecting pieces 520 of the frame ground 500.

The introducing holes 113 and the first solder concave parts 114 are positioned close to each other so that the connecting parts 420 of the earth terminal 400 led out through the introducing holes 113 and the first connecting pieces 520 of the frame ground 500 exposed from the first solder concave parts 114 are integrally solder connectable.

Both ends of the outer face of the wall 110 are formed with a pair of first accommodating concave parts 115 for accommodating second and third connecting ends 312*b*, 312*c* of the second and third fixed contacting point parts 310*b*, 310*c*, respectively. The central part of the lower end of the outer face of the wall 110 is formed with a pair of second accommodating concave parts 116 for accommodating first and fourth connecting ends 312*a*, 312*d* of the first and fourth fixed contacting point parts 310*a*, 310*d*, respectively.

In the above arrangement, the projecting amount of the second connecting ends 312*b*, 312*c* towards the outer face side of the wall 110 and the projecting amount of the first and fourth connecting ends 312*a*, 312*d* towards the outer face side of the wall 110 are reduced by accommodating the second and third connecting ends 312*b*, 312*c* in the pair of first accommodating concave parts 115 and accommodating the first and fourth connecting ends 312*a*, 312*d* in the pair of second accommodating concave parts 116. Consequently, the thickness dimension of the device is reduced.

Furthermore, a pair of second solder concave parts 117 for solder connecting a pair of second connecting pieces 530 of the frame ground 500 is formed at both ends of the lower end of the outer face of the wall 110.

The overhanging parts 130 are formed upright at the edge of the accommodating part 140 of the wall 110. Their inner surfaces form a circular arc shape along the inner peripheral surface of the accommodating part 140. That is, the inner surfaces of the overhanging parts 130 form part of an accommodating part main body 141 of the accommodating part 140 and function as a guide surface for guiding the basal end of the operation member 200 during swinging movement.

The outer surfaces of the overhanging parts 130 are provided with first locking parts 131 for locking the first connecting pieces 520 of the frame ground 500. The first locking parts 131 are rectangular recesses connecting to the first solder concave parts 114, and have first locking convex parts 131*a* formed at the central regions thereof.

The overhanging parts 130 have convex parts 132 of substantially triangular prism shape formed at the upper end thereof. The inner surfaces of the convex part 132 are substantially perpendicular to the upper surface of the bottom plate 120. Furthermore, the lower ends of the overhanging parts 130 serve as contact stopping parts for a pair of arms 620 of the returning means 600.

At opposite ends of the lower surface of the bottom plate 120, there are formed a pair of second locking parts 121 for locking the pair of second connecting pieces 530 of the frame ground 500. The second locking parts 121 are rectangular recesses connecting to the second solder concave parts 117, and have second locking convex parts 121*a* formed at the central regions thereof.

The upper surface of the bottom plate 120 forms a bottom surface of the accommodating part main body 141 of the accommodating part 140. The central part of the upper surface of the bottom plate 120 is formed with a circular arc shaped concave part 122 to avoid interference with a coil part 610 of the returning means 600.

As shown in FIGS. 2 and 3, the accommodating part 140 includes the accommodating part main body 141 that is an accommodating space defined by a concave part 141*a* of a substantially semicircular shape formed on the inner face of the wall 110, the inner surfaces of the overhanging parts 130, and the upper surface of the bottom plate 120; a partition wall 142, arranged at the lower end of the accommodating part main body 141, for partitioning the lower end of the accommodating part main body 141 in the thickness direction; a supporting part 143 of columnar shape formed on the inner surface of the accommodating part main body 141 (i.e., the inner face of the wall 110) that passes through the partition wall 142; and a pair of contact-stopping parts 144 arranged at both ends of the lower end of the partition wall 142.

The accommodating part main body 141 has an opening part 141*b* between the convex parts 132 of the pair of overhanging parts 130. The opening part 141*b* allows the distal end of the operation member 200 to project therethrough.

The pair of contact-stopping part 144 is a projection of right-angled triangular shape inclined towards the outer side.

Figure 5:
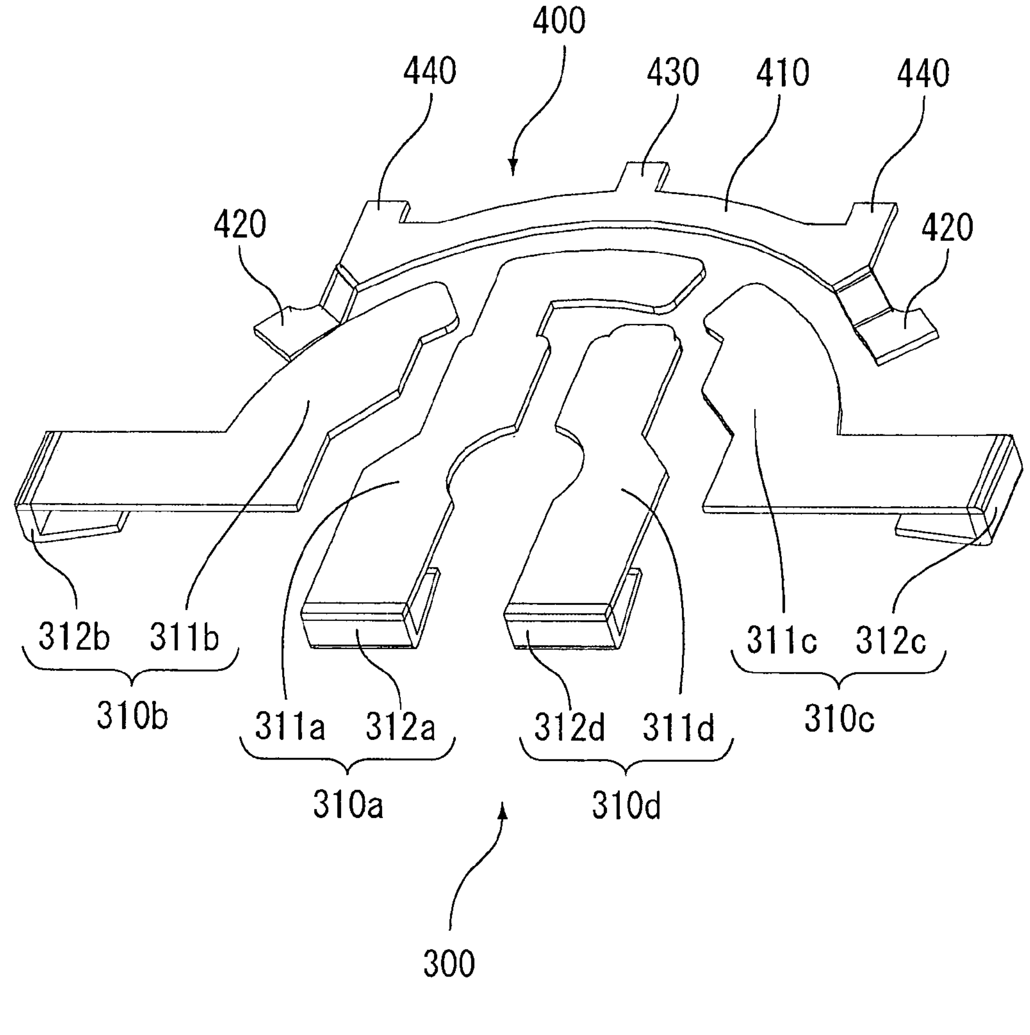
FIG. 5 is a schematic perspective view showing an arrangement of an earth terminal of the device and the fixed contacting point parts of a detecting means.

As shown in FIG. 5, the earth terminal 400 is a metal plate insert molded in the wall 110, and includes a contacting portion 410 of substantially circular arc shape, the pair of connecting parts 420 continuing from the ends of the contacting portion 410, the first projection 430 in a convex shape (i.e., receiving part) formed at the top of the contacting portion 410, and the pair of second projections 440 (i.e., receiving part) in a convex shape formed on opposite sides of the top of the contacting portion 410.

The contacting portion 410 is exposed to the inner face of the wall 110 of the body 100 to contact a contacting convex portion 270 at the basal end of the operation member 200. The pair of connecting parts 420 are bent in the thickness direction of the wall 110 from the contacting portion 410, and exposed to the outer face of the wall 110 from the pair of introducing holes 113.

The first and second projections 430, 440 are projected upward from the first and second cut-out parts 111, 112, and positioned near a main body part 210 of the distal end of the operation member 200.

Figure 6:
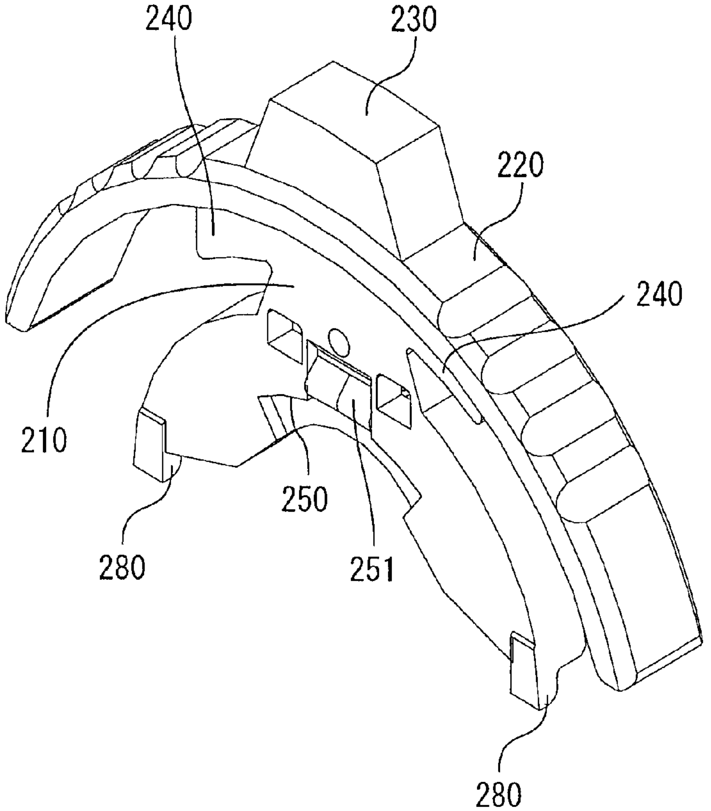
FIG. 6 is a schematic perspective view of an operation member of the device, where (a) is a view seen from one end side in the thickness direction and (b) is a view showing a state in which a movable contacting point part of the detecting means is attached from the other end side in the thickness direction.
Figure 6:
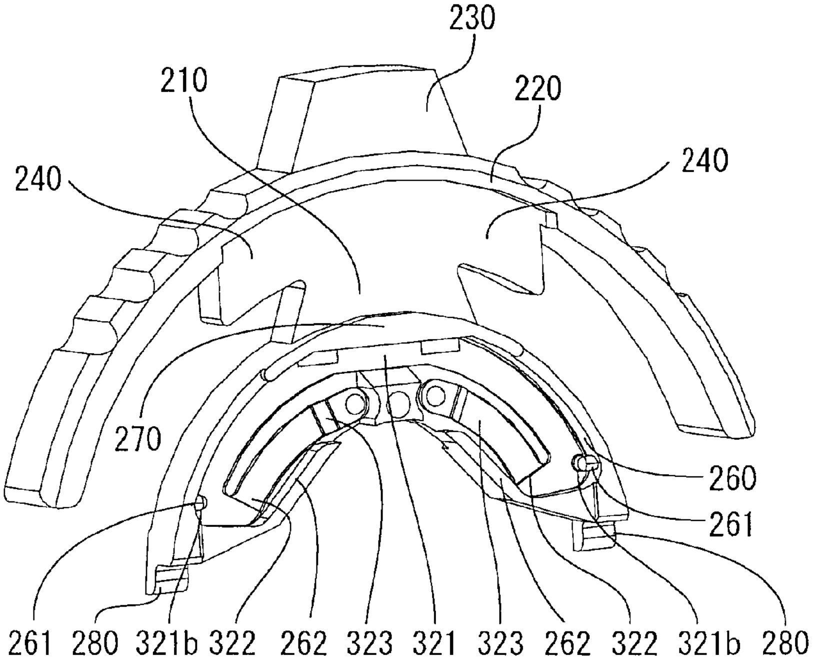
Figure 7:
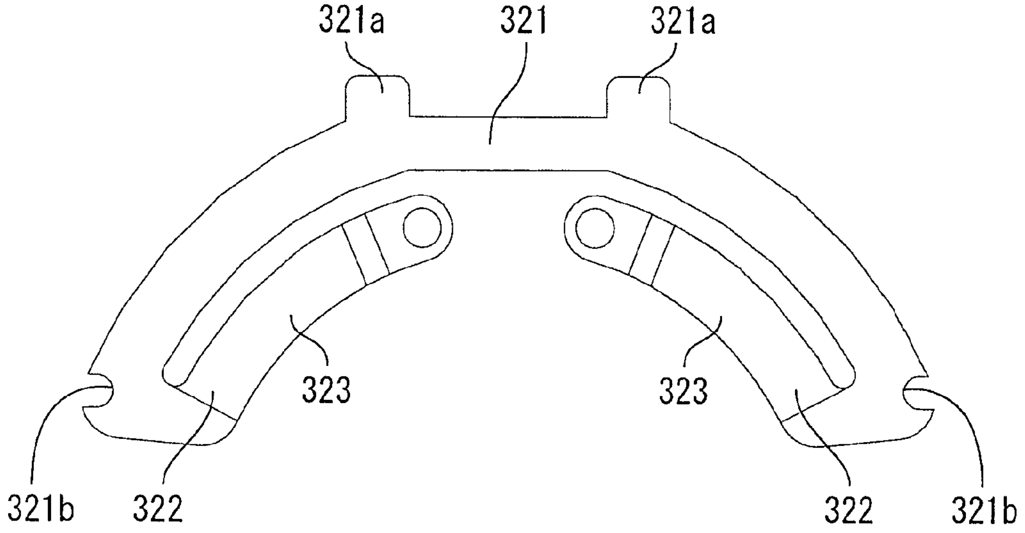
FIG. 7 is a view showing the movable contacting point part of the detecting means of the device, where (a) is a schematic front view of the movable contacting point part and (b) is a schematic rear view of the movable contacting point part.
Figure 7:
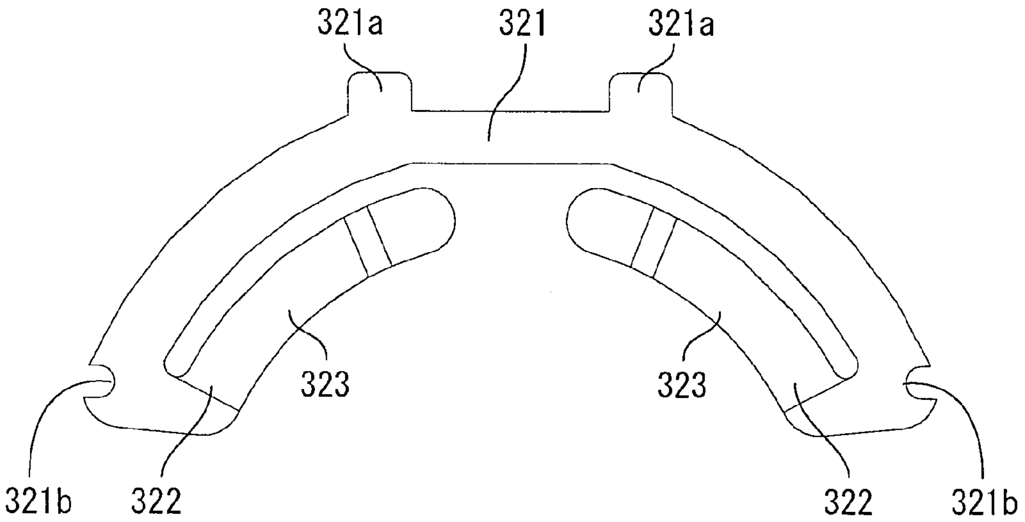

As shown in FIGS. 5, 6, and 7, the movement detecting means 300 includes the first fixed contacting point part 310*a* commonly used for detecting the swinging and pushing movements of the operation member 200; the second and third fixed contacting point parts 310*b*, 310*c*, positioned on opposite sides of the first fixed contacting point part 310*a*, for detecting the swinging movement of the operation member 200; the fourth fixed contacting point part 310*d*, positioned between the first fixed contacting point part 310*a* and the third fixed contacting point part 310*c*, for detecting the pushing movement of the operation member 200; and a movable contacting point part 320 that is attached to the basal end of the operation member 200 and that slidably moves on the first, the second, the third, and the fourth fixed contacting point parts 310*a*, 310*b*, 310*c*, and 310*d* in concert with the operation movement of the operation member 200.

As shown in FIGS. 3 and 5, the first fixed contacting point part 310*a* is a metal plate insert molded in the wall 110. The first fixed contacting point part 310*a* includes a first contacting point part main body 311*a*, having a substantially L-shape rotated to the right by 90° and being exposed from the inner face of the wall 110, and the first connecting end 312*a*, continuing from the lower end of the first contacting point part main body 311*a* and projecting from the bottom plate 120 of the body 100.

The upper portion of the first contacting point part main body 311*a* is curved to a substantially circular arc shape. The lower portion of the first contacting point part main body 311*a* is a substantially straight plate-like body whose central part is bent towards the outer side (i.e., towards the second fixed contacting point part 310*b* side). The inner side of the central part is cut out in a semicircular shape.

The first connecting end 312*a* is bent back to a hook shape, and has the distal end thereof accommodated in the second accommodating concave part 116 on the outer face of the wall 110 of the body 100. Thus, the distal end of the first connecting end 312*a* is exposed to the outer face of the wall 110 of the body 100.

As shown in FIGS. 3 and 5, the second and third fixed contacting point parts 310*b*, 310*c* are also metal plates insert molded in the wall 110. The second and third fixed contacting point parts 310*b*, 310*c* respectively include second and third contacting point part main body 311*b*, 311*c* of substantially circular arc shape exposed from the inner face of the wall 110 and the second and third connecting ends 312*b*, 312*c* continuing from the second and third contacting point part main body 311*b*, 311*c* and projecting from opposite side faces in the width direction of the wall 110 of the body 100.

The second and third contacting point part main bodies 311*b*, 311*c* and the first contacting point part main body 311*a* are arranged so that their upper ends form a substantially semicircular arc shape. The second and third connecting ends 312*b*, 312*c* are bent back to a hook shape and have the distal ends accommodated in the pair of accommodating concave parts 115 on the outer face of the wall 110 of the body 100. The distal ends of the second and third connecting ends 312*b*, 312*b* are thus exposed to the outer face of the wall 110 of the body 100.

As shown in FIGS. 3 and 5, the fourth fixed contacting point part 310*d* is also a metal plate insert molded in the wall 110 and includes a fourth contacting point part main body 311*d* and the fourth connecting end 312*d*. The fourth contacting point part main body 311*d* is a substantially straight body, having a height dimension slightly smaller than the lower portion of the first contacting point part main body 311*a*, and is exposed from the inner surface of the wall 110. The fourth connecting end 312*d* continues from the lower end of the fourth contacting point part main body 311*a* and is projected from the bottom plate 120 of the body 100.

The fourth fixed contacting point part 310*d* has the central part bent towards the outer side (i.e., towards the third fixed contacting point part 310*c* side) and has the inner side of the central part cut out to a semicircular shape.

The fourth connecting end 312*d* is bent back to a hook shape and has the distal end accommodated in the second accommodating concave part 116 on the outer face of the wall 110 of the body 100. The distal end of the fourth connecting end 312*d* is thus exposed to the outer face of the wall 110 of the body 100.

As shown in FIGS. 6 and 7, the movable contacting point part 320 includes an attachment part 321 of substantially circular arc shape to be attached to the basal end of the operation member 200, a pair of curved parts 322 (or bent parts) curved in a direction of moving away from both ends of the attachment part 321, and a pair of contacts 323 of substantially circular arc shape continuing from the pair of curved parts 322 and slidably contacting the first, second, third, and fourth fixed contacting point parts 310*a*, 310*b*, 310*c*, 310*d*.

A pair of temporary joining projections 321*a* in a convex shape is formed with spacing at the upper end of the attachment part 321. The pair of temporary joining projections 321*a* is fitted into a pair of attachment holes (not shown) formed at the upper end face of an attachment concave part 260 of the operation member 200. That is, the movable contacting point part 320 is temporary joined to the attachment concave part 260 by fitting the pair of temporary joining projections 321*a* into the pair of attachment holes.

A pair of boss grooves 321*b* of substantially circular shape is formed at both ends of the attachment parts 321. The pair of boss grooves 321*b* are respectively fitted with a boss 261 of the attachment concave part 260 of the operation member 200. Welding the boss 261, the attachment part 321 is secured to the attachment concave part 260 of the operation member 200.

The pair of curved parts 322 are curved so that the distal ends of the pair of contacts 323 project out from the attachment concave part 260 of the operation member 200 (i.e., in the direction of moving away from the attachment part 321). Thus, when the pair of contacts 323 contact the first, second, third, fourth fixed contacting point part 310*a*, 310*b*, 310*c*, 310*d*, the pair of curved parts 322 elastically deform, thereby pressing the pair of contacts 323 against the first, second, third, fourth fixed contacting point part 310*a*, 310*b*, 310*c*, 310*d*.

As shown in FIGS. 2 and 6, the operation member 200 is a molded article made of resin. The basal end of the operation member 200 is a two-way region of a substantially circular arc shape. The basal end of the operation member 200 is guided by the inner surface of the pair of overhanging parts 130 of the body 100 and supported by the pair of arms 620 of the returning means 600, thereby enabling swinging and pushing movements.

An anastatic concave part 250 having a substantially anastatic shape in front view is formed at one end face in the thickness direction of the basal end of the operation member 200. A contacting part 251 is formed at the upper end of the anastatic concave part 250. The contacting part 251 is a hill shaped convex part that rides over a hill part 513 of the frame ground 500 in response to the pushing operation.

The attachment concave part 260 of substantially circular arc shape to be attached with the movable contacting point part 320 of the movement detecting means 300 is arranged on the other end face in the thickness direction of the basal end of the operation member. The pair of attachment holes (not shown) to which the pair of temporary joining projections 321*a* of the movable contacting point part 320 are fitted is formed at the upper end face of the attachment concave part 260. The welding bosses 261 to be fitted into the pair of boss grooves 321*b* of the movable contacting point part 320 are formed on the attachment concave part 260. Furthermore, both edge parts 262 on the lower side of the attachment concave part 260 are inclined towards the pair of curved parts 322 of the movable contacting point part 320 attached to the attachment concave part 260. The edge parts 262 on the lower side of the attachment concave part 260 thus do not interfere with the elastically deformed pair of contacts 323.

Furthermore, the contacting convex portion 270 having a substantially circular arc shape is formed on the upper edge of the attachment concave part 260. The contacting convex portion 270 is guided by the upper edge of a substantially semi-circular shaped concave part of the accommodating part main body 141 of the body 100 and is slidably contacted to the contacting portion 410 of the earth terminal 400.

A pair of locking projections 280 is formed at one end in the thickness direction of the two distal end faces of the basal end of the operation member 200. As shown in FIG. 2, the pair of locking projections 280 locks the pair of arms 620 of the returning means 600 between the edges of the concave part 141*a* of the accommodating part main body 141 of the wall 110. The other end in the thickness direction of the two distal end faces of the basal end of the operation member 200 is a region to which the pair of arms 620 of the returning means 600 contact, and faces the pair of contact-stopping parts 144 of the accommodating part 140 in a contacting manner by way of the pair of arms 620 of the returning means 600.

As shown in FIGS. 2 and 6, the distal end of the operation member 200 includes a main body part 210 of a substantially trapezoidal shape arranged continuing from the basal end of the operation member 200, an arm part 220 of substantially semicircular arc shape arranged at the upper end of the main body part 210, an operation convex part 230 arranged at the top of the arm part 220, and a pair of projections 240 of circular arc shape arranged at both ends of the main body part 210.

The thickness dimension of the main body part 210 and the pair of projections 240 is a dimension enabling fitting into the opening part 141*b* of the accommodating part main body 141 of the body 100 in the pushing operation. The width dimension of the main body part 210 and the pair of projections 240 is a dimension slightly smaller than the width dimension of the opening part 141*b* (i.e., distance between the pair of convex parts 132).

As shown in FIG. 2, the returning means 600 includes the coil part 610, and the pair of arms 620 continuing from both ends of the coil part 610.

The coil part 610 has an inner diameter larger than the outer diameter of the supporting part 143 of the body 100, so that the supporting part can be inserted therein. The coil part 610 is thus supported by the supporting part 143.

The pair of arms 620 extends substantially horizontally, and contacts the other ends in the thickness direction of the two distal end faces of the basal end of the operation member 200 and the lower end of the overhanging part 130 of the body 100. The arms 620 thus urge the two distal end faces of the basal end of the operation member 200 substantially equally towards the inner surface of the overhanging parts 130 (i.e., upward), thereby holding the operation member 200 at the neutral position perpendicular to the bottom surface of the accommodating part 140.

Figure 8:
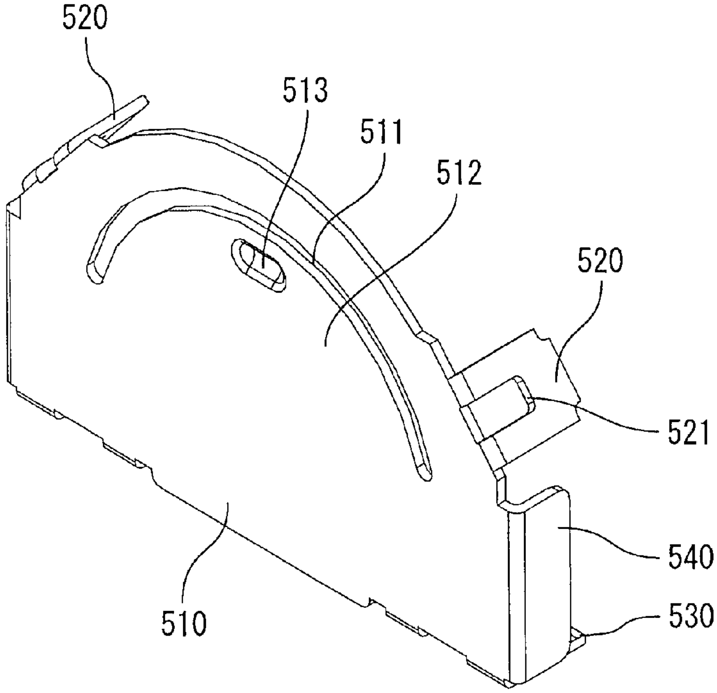
FIG. 8 is a schematic perspective view of the frame ground of the device, where (a) is a view seen from one end side in the thickness direction and (b) is a view seen from the other end side in the thickness direction.
Figure 8:
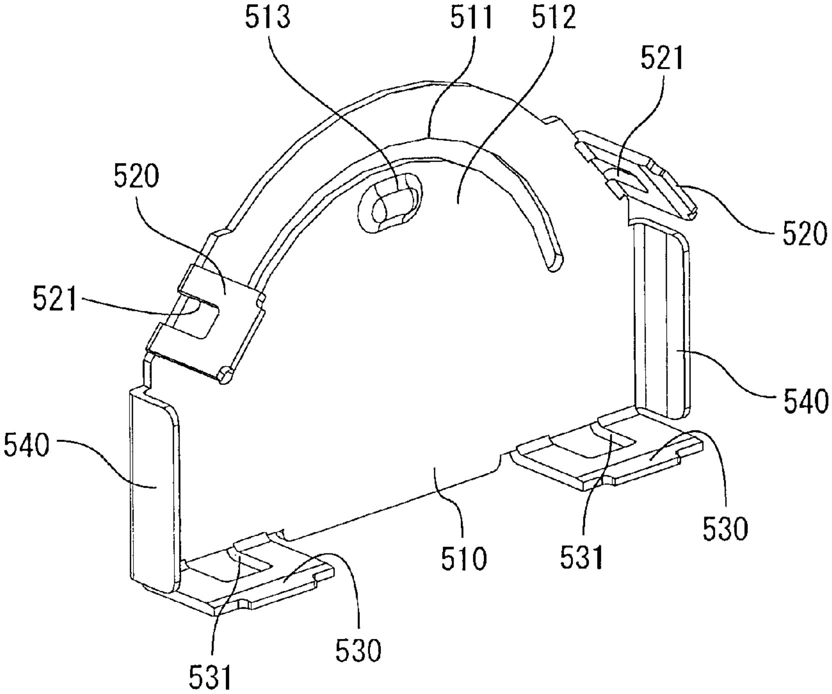

As shown in FIGS. 1 and 8, the frame ground 500 is a plate shaped body made of metal that includes a frame main body 510 of substantially semicircular shape, a pair of first connecting pieces 520 arranged at a right angle at the edge on both sides of the top of the frame main body 510, a pair of second connecting pieces 530 arranged at a right angle at both ends in the width direction of the lower end of the frame main body 510, and a pair of side plate parts 540 arranged at both ends in the width direction of the lower end of the frame main body 510.

The first and second connecting pieces 520, 530 are locking strips of substantially rectangular shape to be locked to the first and second locking parts 131, 121 of the body 100. First and second locking holes 521, 531 to be locked to the first and second locking convex parts 131*a*, 121*a* of the first and second locking parts 131, 121 are formed at the central part of the basal end of the first and second connecting pieces 520, 530.

The length dimension of the first and second connecting pieces 520, 530 is a length dimension at which the distal ends are exposed from the first and second solder concave parts 114, 117, respectively, of the body 100 while being locked to the first and second locking parts 131, 121 of the body 100.

The frame main body 510 contacts the basal end of the operation member 200 accommodated in the accommodating part 140 of the body 100 with the first and second connecting pieces 520, 530 locked to the first and second locking parts 131, 121 of the body 100.

A slit 511 of semicircular arc shape, a movable piece part 512 defined by the slit 511, and the hill part 513 in a convex shape formed at the top of the central part of the movable piece part 512 are arranged at the central part of the upper end of the frame main body 510.

The hill part 513 contacts the contacting part 251 through the pushing movement of the operation member 200. The movable piece part 512 thereby elastically deforms to the outer side.

As shown in FIG. 1, the circuit board 10 is attached to the outer face of the wall 110 of the body 100. Pairs of first and second earth patterns 11, 12 and pairs of first and second electrode patterns 13, 14 are formed on the surface of the circuit board 10 facing the body, as shown in FIG. 1(*b*).

The pair of first earth patterns 11 are arranged on the circuit board 10 so as to correspond to the positions of the pair of connecting parts 420 of the earth terminals 400 and the distal ends of the pair of first connecting pieces 520 of the frame ground 500, and are integrally solder connected with the pair of connecting parts 420 of the earth terminal 400 and the distal ends of the pair of first connecting pieces 520 of the frame ground 500.

The pair of second earth patterns 12 are arranged on the circuit board 10 so as to correspond to the positions of the distal ends of the pair of second connecting pieces 530 of the frame ground 500, and are solder connected to the distal ends of the pair of second connecting pieces 530 of the frame ground 500.

That is, static electricity charged at the operation member 200 jumps to the first and second projections 430, 440 of the earth terminal 440, and flows to the first earth patterns 11 of the circuit board 10 through the contacting portion 410 and the connecting parts 420. Alternatively, the static electricity flows to the first earth patterns 11 of the circuit board 10 through the contacting portion 410 and the connecting parts 420 of the earth terminal 400. The static electricity may also flow to the first earth patterns 11 of the circuit board 10 through the frame main body 510 and the first connecting pieces 520 of the frame ground 500. The static electricity alternatively flows to the second earth patterns 12 of the circuit board 10 through the frame main body 510 and the second connecting pieces 530 of the frame ground 500.

The pair of first electrode patterns 13 are arranged on the circuit board 10 so as to correspond to the positions of the second and third connecting ends 312*b*, 312*c* of the second and third fixed contacting point parts 310*b*, 310*c*, and are solder connected to the second and third connecting ends 312*b*, 312*c* of the second and third fixed contacting point parts 310*b*, 310*c*.

The pair of second electrode patterns 14 are arranged on the circuit board 10 so as to correspond to the positions of the first and fourth connecting ends 312*a*, 312*d* of the first and fourth fixed contacting point parts 310*a*, 310*d*, and are solder connected to the first and fourth connecting ends 312*a*, 312*d* of the first and fourth fixed contacting point parts 310*a*, 310*d*.

Hereinafter, description will be given of the assembly procedure of the input device configured as described above. First, as shown in FIG. 6(*b*), the pair of temporary joining projections 321*a* of the attachment part 321 of the movable contacting point part 320 are inserted while being positioned at the pair of attachment holes of the attachment concave part 260 of the operation member 200. The movable contacting point part 320 is thereby temporary joined to the attachment concave part 260.

The bosses 261 of the attachment concave part 260 of the operation member are then fitted into the pair of boss grooves 321*b* of the attachment part 321 of the movable contacting point part 320. Welding the boss 261, the attachment part 321 of the movable contacting point part 320 is secured to the attachment concave part 260 of the operation member 200.

As shown in FIG. 2, the supporting part 143 of the body 100 is inserted into the coil part 610 of the returning means 600, and at the same time, the pair of arms 620 are contacted to the lower ends of the pair of overhanging parts 130 of the body 100.

The body 100 is now ready to receive the basal end of the operation member 200 in the accommodating part main body 141 of the accommodating part 140. More particularly, the basal end is accommodated in the accommodating part main body 141 while pushing the two distal end faces of the basal end of the operation member 200 against the pair of arms 620 of the returning means 600. When such pressing of the operation member 200 is released, the basal end of the operation member 200 is biased towards the inner surfaces of the overhanging parts 130 of the body 100 by the biasing force of the returning means 600, and held at the neutral position.

Subsequently, the first and second connecting pieces 520, 530 of the frame ground 500 are locked to the first and second locking parts 131, 121 of the body 100 to attach the frame ground 500 to the body 100. The frame ground 500 thus covers the accommodating part 140 of the body 100.

Thereafter, the pair of first earth patterns 11 of the circuit board 10 are positioned and brought into contact with the pair of connecting parts 420 of the earth terminals 400 and the distal ends of the pair of first connecting pieces 520 of the frame ground 500; the pair of second earth patterns 12 are positioned and brought into contact with the distal ends of the pair of second connecting pieces 530 of the frame ground 500; the pair of first electrode patterns 13 are positioned and brought into contact with the second and third connecting ends 312*b*, 312*c* of the second and third fixed contacting point parts 310*b*, 310*c*; and the pair of second electrode patterns 14 are positioned and brought into contact with the first and fourth connecting ends 312*a*, 312*d* of the first and fourth fixed contacting point parts 310*a*, 310*d*.

In this state, flowing solder into the pair of introducing holes 113 and the pair of first solder concave parts 114 of the wall 110 of the body 100, the pair of connecting part 420 of the earth terminals 400 and the distal ends of the pair of first connecting pieces 520 of the frame ground 500 are solder connected to the pair of first earth patterns 11. Similarly, flowing solder into the pair of second solder concave parts 117 of the wall 110, the distal ends of the pair of second connecting pieces 530 of the frame ground 500 are solder connected to the pair of second earth patterns 12.

Furthermore, flowing solder into the pair of first accommodating concave parts 115 of the wall 110 of the body 100, the second and third connecting ends 312*b*, 312*c* of the second and third fixed contacting point parts 310*b*, 310*c* are solder connected to the pair of first electrode patterns 13. Similarly, flowing solder into the pair of second accommodating concave parts 116 of the wall 110 of the body 100, the first and fourth connecting ends 312*a*, 312*d* of the first and fourth fixed contacting point parts 310*a*, 310*d* are solder connected to the pair of second electrode patterns 14. These solder connections may be performed all at once using solder reflow.

Hereinafter, description will be given of how to use the input device assembled as above and how each section thereof.

First, when the operation member 200 is swinging operated in one direction from the neutral position, one of the contacts 323 of the movable contacting point part 320 slidably contacts the upper end of the first contacting point part main body 311*a* of the first fixed contacting point part 310*a*, and the other contact 323 slidably contacts the third contacting point part main body 311*c* of the third fixed contacting point part 310*c*. The first fixed contacting point part 310*a* and the third fixed contacting point part 310*c* thereby become electrically continuous, and a signal is output to an electronic equipment (not shown).

When the operation member 200 is swinging operated in the direction opposite the above direction, one contact 323 of the movable contacting point part 320 slidably contacts the second contacting point part main body 311*b* of the second fixed contacting point part 310*b*, and the other contact 323 slidably contacts the upper end of the first contacting point part main body 311*a* of the first fixed contacting point part 310*a*. The first fixed contacting point part 310*a* and the second fixed contacting point part 310*b* thereby become electrically continuous, and a signal is output to an electronic equipment (not shown).

In time of the swinging operation, one of the pair of projections 240 of the operation member 200 is positioned above one of the pair of convex parts 132 so as to be contactable therewith. Thus, the pushing operation of the operation member 200 in time of the swinging operation is prevented by positioning one projection 240 at the position above one convex part 132 so as to be contactable therewith.

The arm 620 on the operating direction side is pressed against the distal end face on the moving direction side of the basal end of the operation member 200, and the arm 620 on the non-operating direction side is maintained in a state contacting the lower end of the corresponding overhanging part 130 of the body 100, so that the coil part 610 is compressed. At this moment, the distal end face on the moving direction side of the basal end of the operation member 200 contacts the contact-stopping part 144 on the operating direction side of the accommodating part 140 by way of the arm 620 on the operating direction side. The pushing operation of the operation member 200 in time of the swinging operation is thereby also prevented.

When the operation member 200 is released thereafter, the arm 620 on the operating direction side presses the distal end face on the moving direction side of the basal end of the operation member 200 to return the operation member to the neutral position.

When the operation member 200 is pushing operated, one of the contacts 323 of the movable contacting point part 320 slidably contacts the lower end of the first contacting point part main body 311*a* of the first fixed contacting point part 310*a*, and the other contact 323 slidably contacts the fourth contacting point part main body 311*d* of the fourth fixed contacting point part 310*d*. The first fixed contacting point part 310*a* and the fourth fixed contacting point part 310*d* thereby become electrically continuous, and a signal is output to an electronic equipment (not shown).

Both outer side faces in the width direction of the pair of projections 240 of the operation member 200 are guided by the inner surfaces of the pair of concave parts 132 of the body 100, whereby the swinging operation of the operation member 200 in time of the pushing operation is prevented. At the same time, the pair of arms 620 is pressed against the two distal end faces of the basal end of the operation member 200, so that the coil part 610 is compressed. The two distal end faces of the basal end of the operation member 200 contact the pair of contact-stopping parts 144 of the accommodating part 140. The swinging operation of the operation member 200 in time of the pushing operation is thereby also prevented.

In time of the pushing operation of the operation member 200, the contacting part 251 of the operation member 200 contacts the hill part 513 of the frame ground 500 and rides over the hill part 513. The movable piece part 512 then elastically deforms. The operation feeling is thereby generated in the pushing operation of the operation member 200.

When the operation member 200 is thereafter released, the pair of arms 620 presses the two distal end faces of the basal end of the operation member 200 upward to return the operation member to the neutral position.

In an input device as discussed above, the earth terminal 400 and the first, second, third, and fourth fixed contacting point parts 310*a*, 310*b*, 310*c*, and 310*d* are insert molded to the body 100, in a state that the connecting parts 420 of the earth terminal 400 and the first, second, third, and fourth connecting ends 312*a*, 312*b*, 312*c*, and 312*d* of the first, second, third, and fourth fixed contacting point parts 310*a*, 310*b*, 310*c*, and 310*d* are exposed from the outer surface of the wall 110 of the body 100. Thus, the earth terminal 400 and the first, second, third, and fourth fixed contacting point parts 310*a*, 310*b*, 310*c*, and 310*d* can be easily assembled to the body 100 without performing a separate preceding or following process as in the prior art. Furthermore, in addition to the connecting parts 420 of the earth terminal 400 and the first, second, third, and fourth connecting ends 312*a*, 312*b*, 312*c*, and 312*d* of the first, second, third, and fourth fixed contacting point parts 310*a*, 310*b*, 310*c*, and 310*d* exposed from the outer surface of the wall 110 of the body 100, the distal ends of the first and second connecting pieces 520, 530 of the frame ground 500 are also exposed from the outer surface of the wall 110 so that all of the said elements can be solder connected to the circuit board 10 at one time. Thus, the earth terminal 400, and the first, second, third, and fourth fixed contacting point parts 310*a*, 310*b*, 310*c*, and 310*d* and the frame ground 500 are easily electrically connected to the circuit board 10 without performing a separate preceding or following process as in the prior art. The assembly of the components to the body 100 and electrical connection task of each component to the circuit board 10 can thus be very easily performed, whereby the manufacturing steps can be reduced and the cost can also be reduced.

The body 100 may be of any type as long as the accommodating part is arranged at one end and the circuit board can be attached to the other end.

Any change in design can be made on the earth terminal 400, as long as it is a terminal integrally arranged with the body and includes a receiving part exposed from the body and positioned near the operation member and a connecting part exposed from the other end face of the body and solder connectable to the earth pattern of the circuit board.

It is preferable to provide the frame ground 500 as a countermeasure against electrostatic discharge through the operation member 200, but the frame ground may be omitted. In this case, it is possible to provide a frame that simply covers the accommodating part of the body. Although it is discussed above that the first and second connecting pieces 520, 530 of the frame ground 500 serve as locking pieces, they are not limited to such configuration. That is, separately from the locking pieces, there may be provided connecting pieces merely for connecting with the earth patterns 11.

The shapes of the first, second, third, and fourth fixed contacting point parts 310*a*, 310*b*, 310*c*, and 310*d* and the movable contacting point part 320 may be of any shape as long as the movable contacting point part slidably contacts the fixed contacting point parts in accordance with the movement of the operation member. Moreover, design change may be made to have the fixed contacting point parts as resistor patterns to constitute variable resistors.

The above described arrangement of the connecting parts 420 of the earth terminal 400; the first and second connecting pieces 520, 530 of the frame ground 500; and the first, second, third, and fourth connecting ends 312*a*, 312*b*, 312*c*, and 312*d* of the first, second, third, the fourth fixed contacting point parts 310*a*, 310*b*, 310*c*, and 310*d* of the movement detecting means 300 is merely one example and is not limited thereto. The arrangement of the earth patterns 11, 12 and the electrode patterns 13, 14 of the circuit board 10 may be optionally changed in design according to the arrangement of the connecting parts 420 of the earth terminal 400; the first and second connecting pieces 520, 530 of the frame ground 500; and the first, second, third, and fourth connecting ends 312*a*, 312*b*, 312*c*, and 312*d* of the first, second, third, and fourth fixed contacting point parts 310*a*, 310*b*, 310*c*, and 310*d* of the movement detecting means 300.

The operation member 200 may be of any type as long as its basal end is accommodated in the accommodating part of the body and its distal end is projected from the accommodating part so as to be operable. Although it is described above that the operation member 200 can be operated in two directions (i.e., swinging and pushing operable), but the operation member may be adapted only for one type of operation or may be swinging operable in multi directions. The neutral position of the operation member can be set at any point.

The returning means 600 may be of any type as long as it can return the operation member to the neutral position.

What is claimed is:

1. An input device mountable on a circuit board, the circuit board including an electrode pattern and an earth pattern, the input device comprising:

a body having a board mounting face to be placed on the circuit board and an accommodating part, the accommodating part having an inner surface located on an opposite side of the body from the board mounting face;

an operation member having a basal end accommodated in the accommodating part and a distal end projected from the accommodating part in an operable manner;

a fixed contacting point part being embedded in the body and having a part exposed from the inner face of the accommodating part, the fixed contacting part being electrically connectable to the electrode pattern of the circuit board;

a movable contacting point part arranged at the basal end of the operation member and slidably movable on the exposed part of the fixed contacting point part in concert with operation movement of the operation member; and an earth terminal embedded in the body for discharging static electricity charged in the operation member, wherein the earth terminal includes:

a receiving part exposed from the body and positioned near the operation member and a connecting part exposed from the board mounting face of the body and solder connectable to the earth pattern of the circuit board.

2. The input device according to claim 1, further comprising:

a frame ground attachable to the body so as to cover the accommodating part and contactable with the basal end of the operation member; wherein the frame ground includes a connecting piece exposed from the board mounting face of the body and solder connectable to the earth pattern of the circuit board.

3. The input device according to claim 2, wherein the connecting piece of the frame ground and the connecting part of the earth terminal are exposed from the board mounting face of the body so as to be positioned close to each other and solder connectable integrally to the earth pattern of the circuit board.

4. The input device according to claim 2, wherein the connecting piece of the frame ground functions as a locking piece and, in a state of being locked to a locking part formed on the body, a distal end of the connecting piece is projected to a board mounting face side of the body.

5. The input device according to claim 3, wherein the connecting piece of the frame ground functions as a locking piece and, in a state of being locked to a locking part formed on the body, a distal end of the connecting piece is projected to a board mounting face side of the body.

6. The input device according to claim 1, wherein the fixed contacting point part includes a connecting end exposed from the board mounting face of the body and solder connectable to the electrode pattern of the circuit board.

7. The input device according to claim 6, wherein an accommodating concave part for accommodating the connecting end of the fixed contacting point part is formed in the board mounting face of the body.

8. The input device according to claim 1, wherein the operation member is swinging operable to either side from an neutral position substantially perpendicular to a bottom surface of the accommodating part and is pushing operable from the neutral position, the bottom surface extending perpendicular to the inner face of the accommodating part;

the accommodating part of the body includes an opening part for projecting the distal end of the operation member in an operable manner;

a pair of projections is formed at opposite ends in a swinging direction of the distal end of the operation member; and the pair of projections are guided by both edges in the swinging direction of the opening part when the operation member is pushed down, and one of the projections is contactable with one of the edges in the swinging direction of the opening part when the operation member is swung.

9. The input device according to claim 8, further comprising a frame ground attachable to the body so as to cover the accommodating part and contactable with the basal end of the operation member, wherein the frame ground includes a movable piece part defined by a slit, and a hill part formed at a central part of the movable piece part; and the basal end of the operation member is provided with a contacting part in a convex shape for riding over the hill part upon pushing movement of the operation member.

10. The input device according to claim 1, wherein the earth terminal is substantially arc-shaped that extends along an upper portion of the body in a swinging direction of the operation member.

11. The input device according to claim 8, wherein the earth terminal is substantially arc-shaped that extends along an upper portion of the body in a swinging direction of the operation member.

12. The input device according to claim 1, wherein the earth terminal has a contacting portion of substantially arc shape, the contacting portion being embedded at a position in the body closer to the distal end of the operation member than a position where the fixed contacting point part.

13. The input device according to claim 8, wherein the earth terminal has a contacting portion of substantially arc shape, the contacting portion being embedded at a position in the body closer to the distal end of the operation member than a position where the fixed contacting point part.

14. The input device according to claim 12, the receiving part includes:

a first projection in a convex shape, formed at a top of the contacting portion, extending along the end of the operation member and projecting from the body, and a pair of second projections in a convex shape, formed on opposite sides of the contacting portion and projecting from the body in the same direction as the first projection.

15. The input device according to claim 13, the receiving part includes:

a first projection in a convex shape, formed at a top of the contacting portion, extending along the end of the operation member and projecting from the body, and a pair of second projections in a convex shape, formed on opposite sides of the contacting portion and projecting from the body in the same direction as the first projection.

16. The input device according to claim 1, wherein the board mounting face of the body has an introducing hole, and the connecting part of the earth terminal is exposed to a board mounting face side of the body through the introducing hole.

17. The input device according to claim 8, wherein the board mounting face of the body has an introducing hole, and the connecting part of the earth terminal is exposed to a board mounting face side of the body through the introducing hole.

* * * * *